United States Patent
Mauro et al.

(10) Patent No.: US 7,148,653 B2
(45) Date of Patent: Dec. 12, 2006

(54) METHOD OF DIAGNOSING A MOTOR VEHICLE BATTERY BASED ON PARAMETERS RELATED TO AN ELECTRIC QUANTITY SUPPLIED BY THE BATTERY

(75) Inventors: Marco Mauro, San Remo (IT); Maria Paola Bianconi, Torino (IT); Andrea Fortunato, Orbassano (IT); Mario Gambera, Orbassano (IT)

(73) Assignee: C.R.F. Societá Consortile per Azioni, Orbassano (IT)

( * ) Notice: Subject to any disclaimer, the term of this patent is extended or adjusted under 35 U.S.C. 154(b) by 208 days.

(21) Appl. No.: 10/655,747

(22) Filed: Sep. 5, 2003

(65) Prior Publication Data

US 2004/0130325 A1     Jul. 8, 2004

(30) Foreign Application Priority Data

Sep. 6, 2002    (IT)    ............... TO2002A0780

(51) Int. Cl.
*H01M 10/44*    (2006.01)

(52) U.S. Cl. .................................................. 320/104
(58) Field of Classification Search ............... 320/104; 324/426, 427, 430, 433
See application file for complete search history.

(56) References Cited

U.S. PATENT DOCUMENTS

| 4,939,502 A | 7/1990 | Ito et al. .................... 340/438 |
| 5,130,659 A | 7/1992 | Sloan ......................... 324/435 |
| 6,118,252 A | 9/2000 | Richter ....................... 320/132 |

FOREIGN PATENT DOCUMENTS

GB    2 213 600 A    8/1989

*Primary Examiner*—Edward H. Tso
(74) *Attorney, Agent, or Firm*—Seed IP Law Group PLLC

(57) ABSTRACT

There is described a method of diagnosing a motor vehicle battery, wherein, at each start-up of the vehicle engine, a number of parameters, related to the pattern of an electric quantity supplied by the battery during a transient start-up state of the engine, are recorded; and the recorded parameters are then memorized to create a database which is used to determine the charge status of the battery.

20 Claims, 4 Drawing Sheets

METHOD OF DIAGNOSING A MOTOR VEHICLE BATTERY BASED ON PARAMETERS RELATED TO AN ELECTRIC QUANTITY SUPPLIED BY THE BATTERY

BACKGROUND OF THE INVENTION

1. Field of the Invention

The present invention relates to a method of diagnosing a motor vehicle battery.

2. Description of the Related Art

As is known, like any other component, batteries supplying the electrical power required for normal operation of a vehicle, such as a car, are subject, with use, to deterioration and malfunctioning. A faulty battery may be incapable of starting the engine or adequately powering all the connected user devices, which therefore operate poorly. Very often, a vehicle equipped with a battery in poor condition cannot be run at all, and, since the user is normally unable to predict malfunctioning of the battery, no servicing is carried out until a fault actually occurs.

By way of a solution to the problem, diagnosis methods have been devised to determine the charge status of the battery and signal any anomalous operating conditions, so that appropriate servicing may be carried out in time. More specifically, the diagnosis methods devised so far are based on measuring the internal resistance of the battery, which, as is known, is related to various factors, including ageing and the charge of the battery. That is, internal resistance is measured in predetermined battery conditions, is compared with a nominal reference value, and, if a significant difference is detected, an alarm signal is generated.

Known methods, however, have several drawbacks. For the necessary measurements to be made, the battery and/or control unit supervising operation of the engine must be equipped with sensors. More specifically, to measure the internal resistance of the battery, both a voltage and a current sensor are required, whereas one sensor would be more preferable. Using two sensors not only increases cost but also increases the risk of malfunctioning and reduces reliability.

BRIEF SUMMARY OF THE INVENTION

It is an object of the present invention to provide a diagnosis method designed to eliminate the aforementioned drawbacks, and which, in particular, can be implemented using simpler equipment.

According to the present invention, there is provided a method of diagnosing a battery of a motor vehicle, characterized by comprising the steps of:

determining, at each start-up of the engine of said vehicle, a number of parameters related to the pattern of an electric quantity supplied by said battery during a transient start-up state of said engine;

storing said parameters to create at least one database; and determining a charge status of said battery using said database.

According to a further aspect of the invention, the electric quantity is the voltage supplied by the battery.

Since the method according to the invention provides for determining the charge status of the battery on the basis of a single electric quantity, namely the battery voltage, the equipment by which to implement the method calls for only a voltage sensor, and no current sensors, which is clearly an advantage not only in terms of cost but also in terms of reliability by reducing the risk of operating defects.

BRIEF DESCRIPTION OF THE DRAWINGS

A non-limiting embodiment of the invention will be described by way of example with reference to the accompanying drawings, in which.

DETAILED DESCRIPTION OF THE INVENTION

Figure 1:
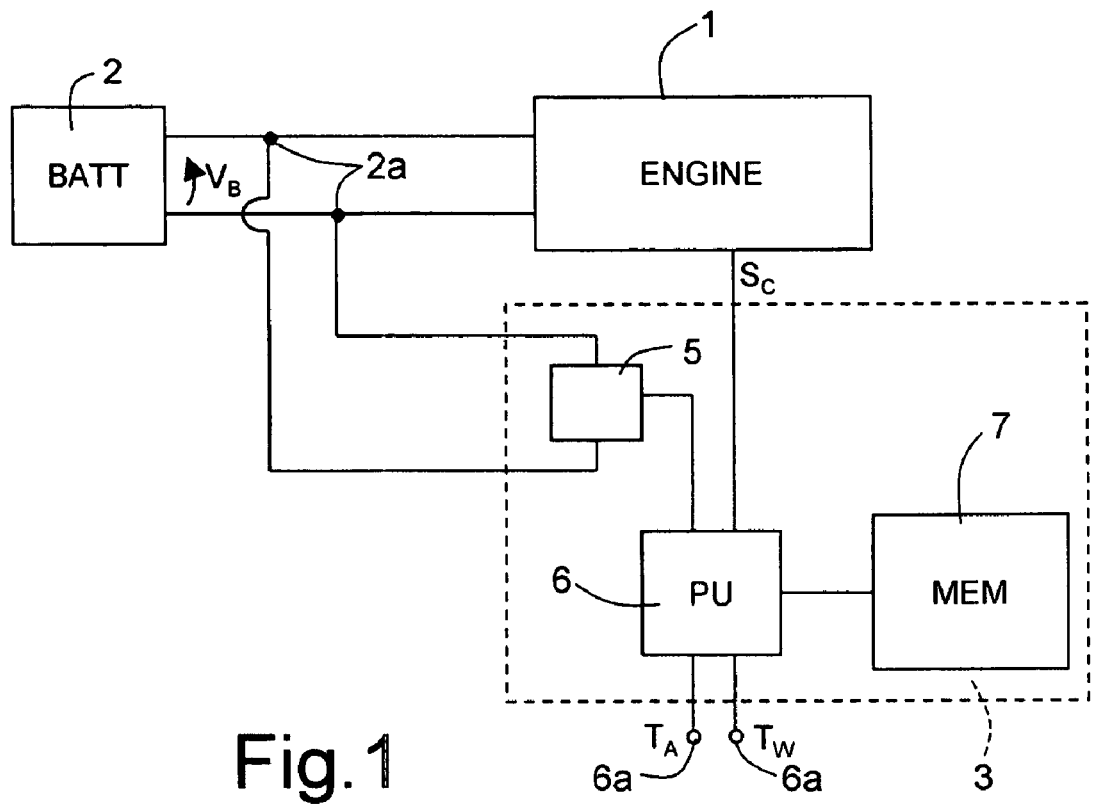
FIG. 1 shows a simplified block diagram of equipment implementing the diagnosis method according to the present invention.

FIG. 1 shows schematically a vehicle engine 1 (vehicle not shown) connected to terminals 2a of a battery 2 supplying a battery voltage $V_B$. For the sake of simplicity, the electrically powered devices of the vehicle are not shown in detail in FIG. 1, but are all considered included in engine 1. A control unit 3, comprising a voltage sensor 5, a processing unit 6, and a memory 7, is connected to both engine 1 and battery 2. More specifically, voltage sensor 5 has inputs connected to terminals 2a of battery 2 to receive battery voltage $V_B$, and an output connected to processing unit 6. In other words, sensor 5 measures the instantaneous battery voltage $V_B$ value, and supplies it to processing unit 6.

Processing unit 6 has inputs 6a receiving a number of operating parameters, such as cylinder intake air temperature $T_A$ and cooling water temperature $T_W$, and an output connected to engine 1 to supply a number of control signals $S_C$, and is two-way connected to memory 7 to read and write data as required.

Figure 2:
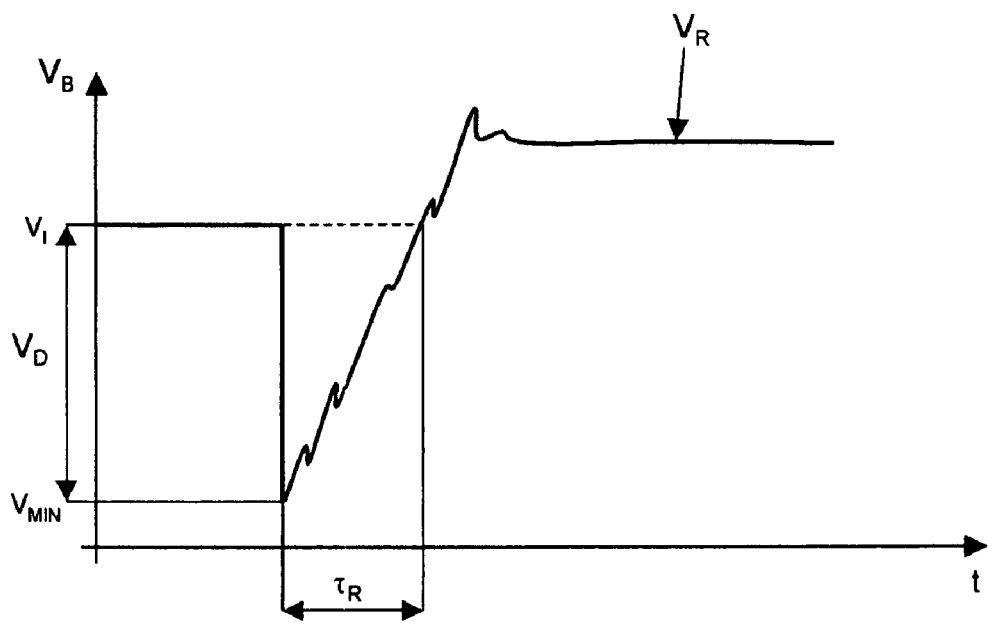
FIG. 2 shows a graph of a quantity relating to the FIG. 1 equipment.

FIG. 2 shows the pattern of battery voltage $V_B$ in a transient startup state of engine 1. Just before start-up, battery voltage $V_B$ has a stable initial value $V_I$, on account of battery 2 supplying substantially no current. When engine 1 is started up, the user devices connected to battery 2 simultaneously draw high start-up currents, so that the battery is temporarily unable to maintain the initial value $V_I$ of voltage $V_B$, which falls more or less instantaneously to a minimum value $V_{MIN}$. More specifically, at this stage, there is a voltage drop of $V_D = V_I - V_{MIN}$. The battery voltage $V_B$ value then rises, exceeds initial value $V_I$, and settles to oscillate about a steady-state value $V_R$ normally higher than initial value $V_I$. More specifically, battery voltage $V_B$ passes from minimum value $V_{MIN}$ to initial value $V_I$ within a rise time $T_R$.

According to observations made by the inventors, initial value $V_I$, voltage drop $V_D$, and rise time $T_R$ are operating parameters related to the charge status of battery 2. That is, for each of the above operating parameters, normal-charge and prealarm-charge ranges can be identified. When the charge status of the battery is normal, variations in the three parameters remain within respective normal-charge ranges between one vehicle mission and the next; whereas, conversely, at least one of them drifts outside the normal-charge or even the prealarm-charge range.

Figure 4:
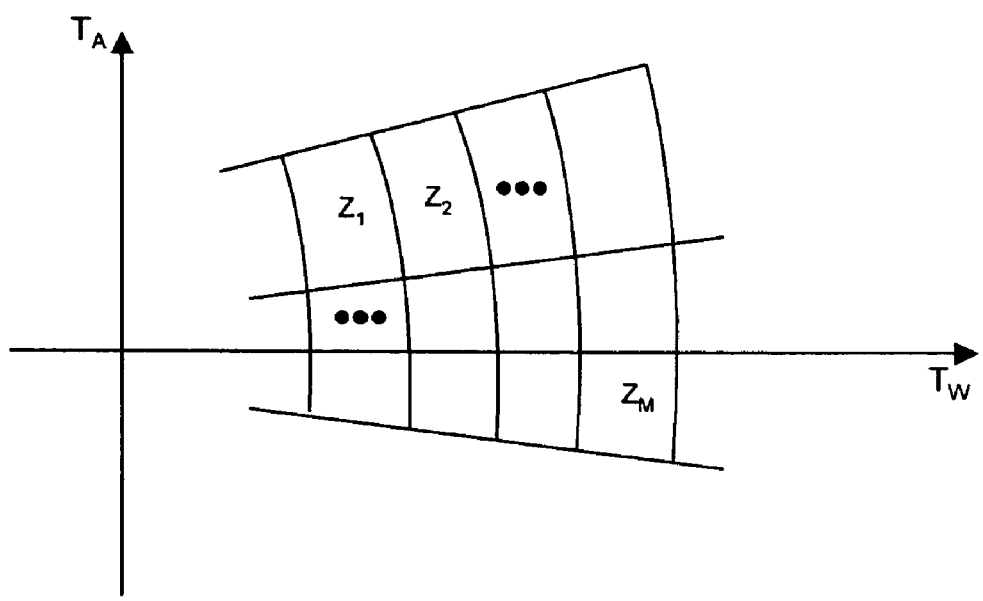
FIG. 4 shows a graph of quantities relating to the diagnosis method according to the present invention.

Moreover, initial value $V_I$, minimum value $V_{MIN}$, and rise time $T_R$ are strongly affected by the operating conditions of engine 1, in particular air temperature $T_A$ and water temperature $T_W$, so that different operating conditions of engine 1 and battery 2, defined by respective sets of air temperature $T_A$ and water temperature $T_W$ values, can be identified. More specifically, each operating condition corresponds to a respective predetermined region $Z_1, Z_2, \ldots, Z_M$ in a $T_A T_W$ diagram, as shown by way of example in FIG. 4.

Figure 3:
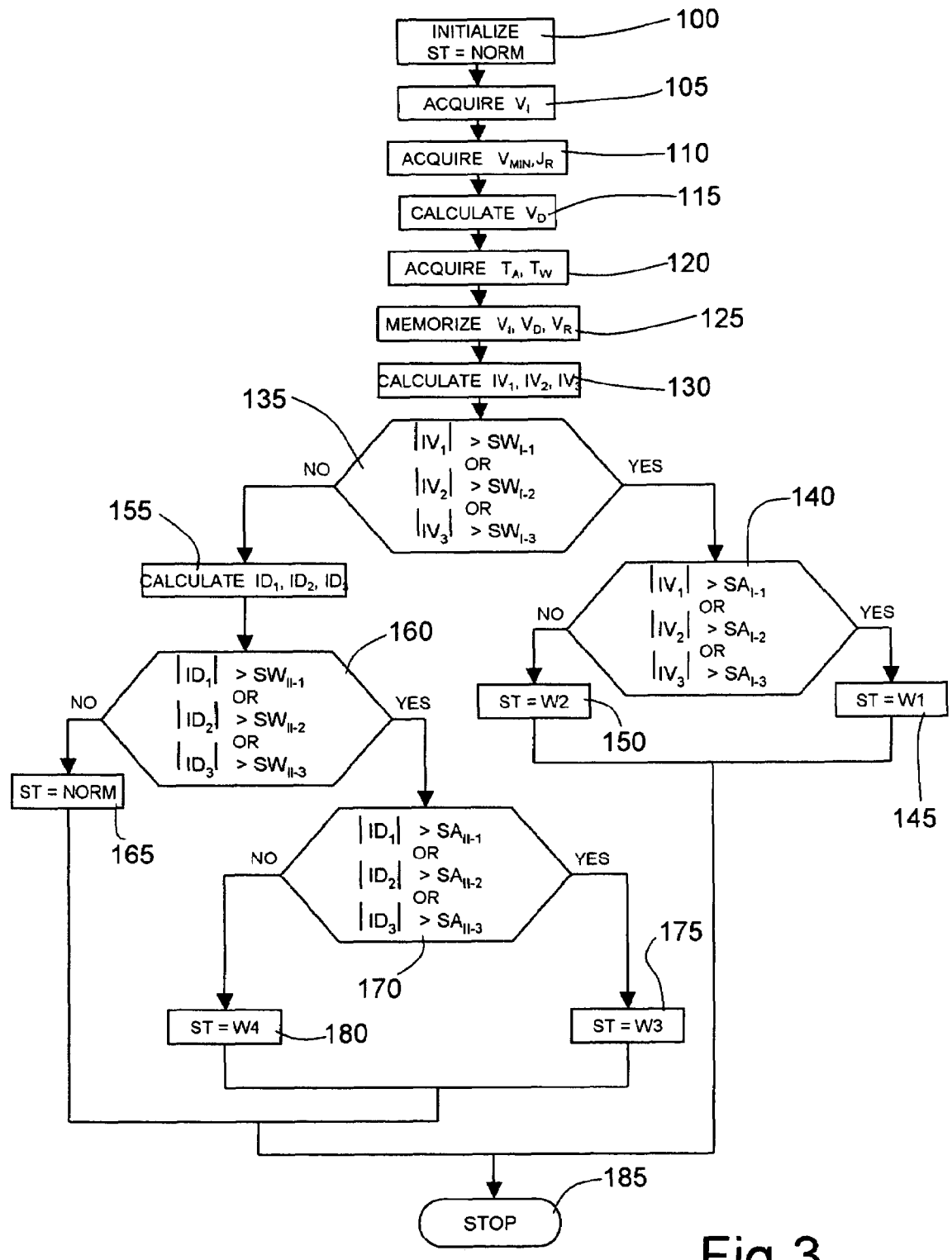
FIG. 3 shows a flow chart of the diagnosis method according to the present invention.

With reference to FIG. 3, when engine 1 is started up, control unit 3 is initialized by setting a status register ST relative to the charge status of battery 2 to an initializing value, e.g. a normal-charge value NORM (block 100).

The initial battery voltage value $V_I$ just before start-up of engine 1 is then acquired (block 105), and is preferably calculated as the average of a predetermined number of battery voltage $V_B$ readings made by voltage sensor 5 before engine 1 is started up.

When the engine is started up, minimum value $V_{MIN}$ and rise time $\tau_R$ are acquired successively (block 110), voltage drop $V_D = V_I - V_{MIN}$ is calculated (block 115), and processing unit 6 acquires air temperature $T_A$ and water temperature $T_W$ (block 120).

Figure 5:
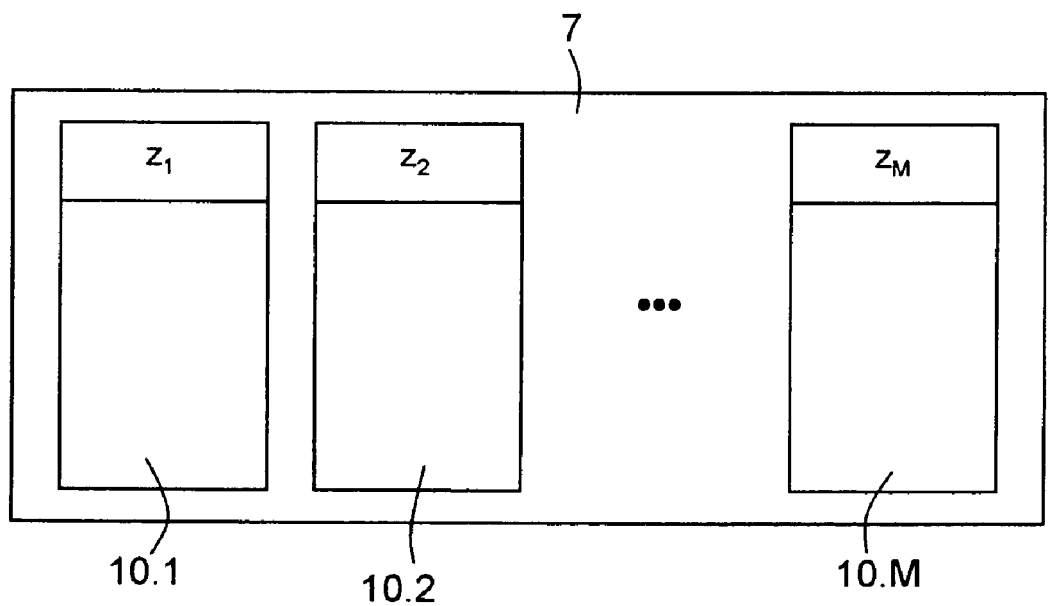
FIG. 5 shows a more detailed block diagram of part of the FIG. 1 equipment.

Initial value $V_I$, voltage drop $V_D$, and rise time $\tau_R$ are then memorized in memory 7 (block 125). More specifically, memory 7 contains a number of tables 10.1, 10.2, ..., 10.M (FIG. 5), each associated with a respective operating condition of engine 1, i.e. with a respective region $Z_1$, $Z_2, \ldots, Z_M$ in the $T_A T_W$ diagram; and each operating condition, as stated, is defined by a respective set of air temperature $T_A$ and water temperature $T_W$ values. At the first start-up, i.e. when battery 2 is new and used for the first time, tables 10.1, 10.2, ..., 10.M are empty, and one of them is incremented at each subsequent start-up. At this stage, one of tables 10.1, 10.2, ..., 10.M corresponding to the present operating condition of engine 1, i.e. to the measured air temperature $T_A$ and water temperature $T_W$ values, is selected, and initial value $V_I$, voltage drop $V_D$, and rise time $\tau_R$ of battery voltage $V_B$ are entered into the selected table 10.1, 10.2, ..., 10.M.

Figure 6:
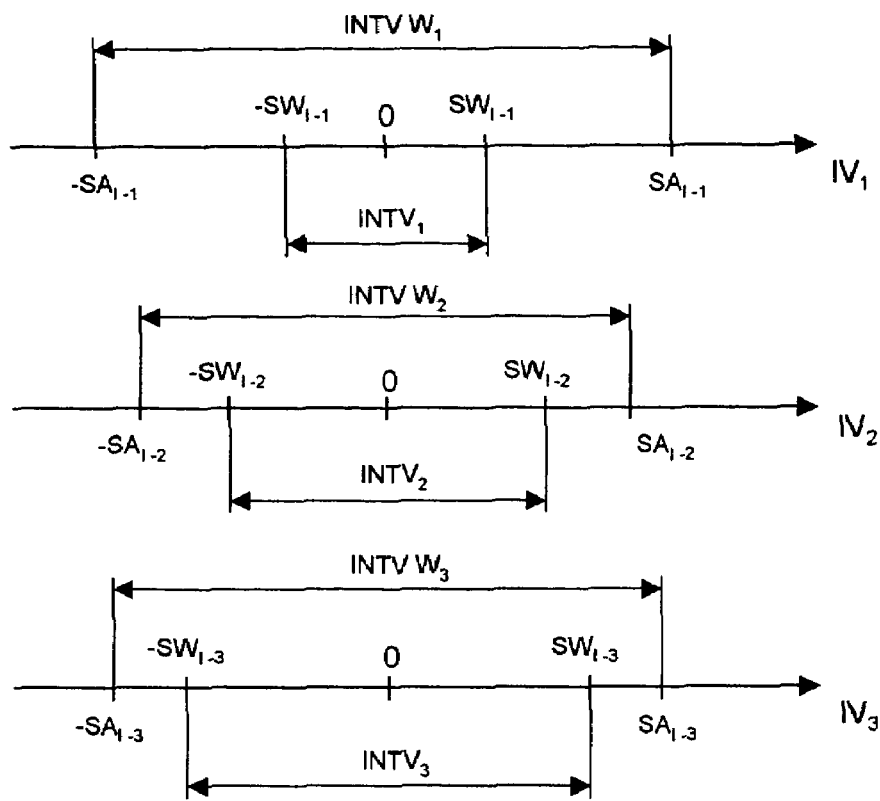
FIGS. 6 and 7 show ranges of quantities relating to the diagnosis method according to the present invention.
Figure 7:
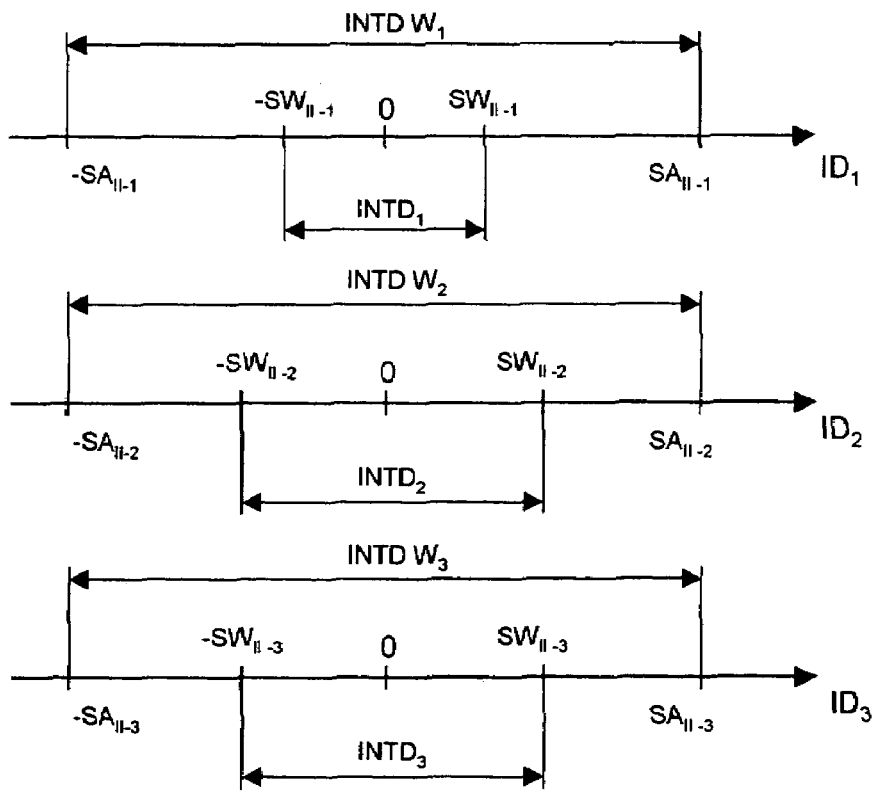

Initial value $V_I$, voltage drop $V_D$, and rise time $\tau_R$ are then processed and compared with the content of the selected table 10.1, 10.2, ..., 10.M (block 130). More specifically, a first, second, and third variation index $IV_1$, $IV_2$, $IV_3$, relative to initial value $V_I$, voltage drop $V_D$, and rise time $\tau_R$ respectively, are calculated on the basis of the difference between each of the three operating parameters measured at start-up of engine 1—here indicated by a time index K—and the corresponding operating parameter last measured at start-up under the same operating conditions (here indicated by a time index K−1). In other words, the operating parameter values to be subtracted to calculate variation indexes $IV_1$, $IV_2$, $IV_3$ are the latest memorized in the selected table 10.1, 10.2, ..., 10.M, so that:

$IV_1(K) = V_I(K) - V_I(K-1)$ $IV_2(K) = V_{MIN}(K) - V_{MIN}(K-1)$ $IV_3(K) = \tau_R(K) - \tau_R(K-1)$ The initial value $V_I$, voltage drop $V_D$, and rise time $\tau_R$ recorded at start-up of engine 1 are therefore correlated with historic data memorized previously under the same operating conditions. A check is then made to determine whether variation indexes $IV_1$, $IV_2$, $IV_3$ exceed, in absolute value, respective first-level warning thresholds $SW_{I-1}$, $SW_{I-2}$, $SW_{I-3}$, which are preferably calibratable (block 135). That is, a respective normal variation range $INTV_1$, $INTV_2$, $INTV_3$, ranging between limits symmetrical with respect to zero (FIG. 6), is determined for each variation index $IV_1$, $IV_2$, $IV_3$. Alternatively, asymmetrical normal variation ranges may also be determined.

If at least one of first, second, and third variation indexes $IV_1$, $IV_2$, $IV_3$ exceeds the respective first-level warning threshold $SW_{I-1}$, $SW_{I-2}$, $SW_{I-3}$, i.e. is outside the respective normal variation range $INTV_1$, $INTV_2$, $INTV_3$ (YES output of block 135), a further test is performed (block 140) to determine whether a respective first-level alarm threshold $SA_{I-1}$, $SA_{I-2}$, $SA_{I-3}$ is also exceeded (again in absolute value). First-level alarm thresholds $SA_{I-1}$, $SA_{I-2}$, $SA_{I-3}$ are also calibratable and higher than respective first-level warning thresholds $SW_{I-1}$, $SW_{I-2}$, $SW_{I-3}$. In other words, warning variation ranges $INTVW_1$, $INTVW_2$, $INTVW_3$, symmetrical with respect to zero and comprising respective normal variation ranges $INTV_1$, $INTV_2$, $INTV_3$, are defined. In this case, too, the warning variation ranges may also be asymmetrical.

If at least one of variation indexes $IV_1$, $IV_2$, $IV_3$ exceeds the respective first-level warning threshold $SW_{I-1}$, $SW_{I-2}$, $SW_{I-3}$, i.e. is also outside the respective warning variation range $INTVW_1$, $INTVW_2$, $INTVW_3$ (YES output of block 140), the status register ST is set to a first alarm value W1 (block 145) indicating a serious malfunction calling for immediate attention. That is, at least one of initial value $V_I$, voltage drop $V_D$, and rise time $\tau_R$ has shown a sharp variation with respect to previously recorded values, thus indicating malfunctioning of battery 2. Conversely, if none of variation indexes $IV_1$, $IV_2$, $IV_3$ exceeds the respective first-level alarm threshold $SA_{I-1}$, $SA_{I-2}$, $SA_{I-3}$ (i.e. if variation indexes $IV_1$, $IV_2$, $IV_3$ are all within respective warning variation ranges $INTVW_1$, $INTVW_2$, $INTVW_3$, but at least one is outside respective normal variation range $INTV_1$, $INTV_2$, $INTV_3$—NO output of block 140), the status register ST is set to a second alarm value W2 (block 150) indicating battery 2 has suddenly shown signs of deterioration, though still with a certain margin of safety. In both the cases described, however, an anomalous charge status of battery 2 is indicated.

If variation indexes $IV_1$, $IV_2$, $IV_3$ are all below respective first-level warning thresholds $SW_{I-1}$, $SW_{I-2}$, $SW_{I-3}$, i.e. are within respective normal variation ranges $INTV_1$, $INTV_2$, $INTV_3$ (NO output of block 135), respective drift indexes $ID_1$, $ID_2$, $ID_3$ of interval N, where N is a whole number, e.g. 10, are calculated (block 155) for initial value $V_I$, voltage drop $V_D$, and rise time $\tau_R$. In this case, from the currently recorded initial value $V_I$, voltage drop $V_D$, and rise time $\tau_R$, are subtracted the corresponding values memorized at a distance of N locations in the selected table 10.1, 10.2, ..., 10.M, i.e. the corresponding operating parameters recorded N start-ups before the last, in the same operating conditions (i.e. with the same air temperature $T_A$ and water temperature $T_W$ values). That is:

$ID_1(K) = V_I(K) - V_I(K-N)$ $ID_2(K) = V_D(K) - V_D(K-N)$ $ID_3(K) = \tau_R(K) - \tau_R(K-N)$ In this case, too, since all the values involved are taken from the same selected table 10.1, 10.2, ..., 10.N, the processed values are acquired under the same operating conditions of engine 1 and battery 2.

Processing unit 6 then determines (block 160) whether at least one of drift indexes $ID_1$, $ID_2$, $ID_3$ exceeds a respective calibratable second-level warning threshold $SW_{II-1}$, $SW_{II-2}$, $SW_{II-3}$, so as to determine, for each drift index $ID_1$, $ID_2$, $ID_3$, a normal drift range $INTD_1$, $INTD_2$, $INTD_3$ ranging between limits symmetrical with respect to zero.

If drift indexes $ID_1$, $ID_2$, $ID_3$ are all below respective second-level warning thresholds $SW_{II-1}$, $SW_{II-2}$, $SW_{II-3}$, i.e. are within respective normal drift ranges $INTD_1$, $INTD_2$, $INTD_3$ (NO output of block 160), the status register ST is set to the normal operation value NORM to indicate normal operation of battery 2 (block 165). Conversely (YES output of block 160), a further test is performed to determine whether at least one of drift indexes $ID_1$, $ID_2$, $ID_3$ also exceeds a respective calibratable second-level alarm threshold $SA_{II-1}$, $SA_{II-2}$, $SA_{II-3}$, i.e. is outside a respective warning drift range $INTDW_1$, $INTDW_2$, $INTDW_3$ (block 170). In this case, too, warning drift ranges $INTDW_1$, $INTDW_2$, $INTDW_3$ range between limits symmetrical with respect to zero, but may also be asymmetrical.

If the above condition is confirmed (YES output of block 170), the status register ST is set to a third alarm value W3 indicating serious ageing of battery 2 (block 175). In fact, even though none of the operating parameters has undergone significant variations over the last N start-ups of engine 1, more gradual deterioration of battery 2 may give rise to variations always of the same sign, so that, over a prolonged period of time, drift of one or more of the operating parameters indicates operation of battery 2 is gradually worsening. If the test condition of block 170 is not confirmed (NO output of block 170), the status register ST is set to a fourth alarm value W4 (block 180) indicating initial deterioration: the charge status of battery 2 is not perfect, but there is still a certain margin of safety. In both cases, however, an anomalous charge status of battery 2 is indicated.

The procedure is then terminated (block 185).

Clearly, changes may be made to the method as described herein without, however, departing from the scope of the present invention.

The invention claimed is:

1. A method of diagnosing a battery of a motor vehicle, the method comprising:
   determining, at each start-up of an engine of said vehicle, a number of parameters related to a pattern of an electric quantity supplied by said battery during a transient start-up state of the engine of said vehicle;
   storing said determined parameters to create at least one database; and
   determining a charge status of said battery using at least some of said determined parameters stored in said database, said determining the charge status being performed without using determined battery temperature.

2. A method as claimed in claim 1 wherein said storing comprises creating a number of databases, each associated with a respective operating condition of said engine and said battery.

3. A method as claimed in claim 2 wherein said operating conditions of said engine and said battery are defined by sets of values of at least one operating quantity.

4. A method as claimed in claim 3 wherein said operating conditions of said engine and said battery are defined by sets of values of first and second operating temperatures of said engine, said first and second operating temperature corresponding to air temperature and water temperature of said engine, respectively.

5. A method as claimed in claim 2, further comprising selecting a database corresponding to a present operating condition of said engine and said battery.

6. A method as claimed in claim 5 wherein said storing comprises entering said parameters into the selected database.

7. A method as claimed in claim 5 wherein said determining said charge status comprises comparing said parameters with content of the selected database.

8. A method as claimed in claim 5 wherein said determining said charge status comprises:
   calculating a number of first indexes, each related to a pattern of a respective said parameter, using the selected database;
   defining respective first operating ranges for said first indexes; and
   determining whether said first indexes fall within the respective said first operating ranges.

9. A method as claimed in claim 8 wherein said determining said charge status comprises:
   defining respective second operating ranges for said first indexes, when said first indexes do not fall within the respective said first operating ranges; and
   determining whether said first indexes fall within the respective said second operating ranges.

10. A method as claimed in claim 8 wherein said determining said charge status comprises:
    calculating a number of second indexes, each related to the pattern of a respective said parameter, using the selected database;
    defining respective third operating ranges for said second indexes; and
    determining whether said second indexes fall within the respective said third operating ranges.

11. A method as claimed in claim 10 wherein said determining said charge status comprises:
    defining respective fourth operating ranges for said second indexes, when said second indexes do not fall within the respective said third operating ranges; and
    determining whether said second indexes fall within the respective said fourth operating ranges.

12. A method as claimed in claim 11, further comprising:
    indicating a normal charge status of said battery when said first indexes fall within the respective said first operating ranges, and said second indexes fall within the respective said third operating ranges; and
    indicating an anomalous charge status in all other cases.

13. A method as claimed in claim 1 wherein said electric quantity is a battery voltage.

14. A method as claimed in claim 1 wherein said parameters comprise:
    an initial value of said electric quantity just before start-up of said engine;
    a drop of said electric quantity just after start-up of said engine to a value below the initial value; and
    a rise time of said electric quantity, from the value below the initial value to at least back to the initial value.

15. A system for diagnosing a battery of a motor vehicle, the system comprising:
    means for determining, at each start-up of an engine of the vehicle, a number of parameters related to a pattern of an electric quantity supplied by the battery during a transient start-up state of the engine of the vehicle;
    means for storing the determined parameters; and
    means for determining a charge status of the battery using the stored parameters, said determining the charge status being performed without using determined battery temperature.

16. The system of claim 15 wherein the electric quantity is a voltage of the battery.

17. The system of claim 15 wherein the parameters include:
- an initial value of the electric quantity just before start-up of the engine;
- a drop of the electric quantity just after start-up of the engine to a value below the initial value; and
- a rise time of the electric quantity, from the value below the initial value to at least back to the initial value.

18. An apparatus to diagnose a battery of a motor vehicle, the apparatus comprising:
- at least one sensor coupleable to the battery to determine, at each start-up of an engine of the vehicle, a number of parameters related to a pattern of an electric quantity supplied by the battery during a transient start-up state of the engine of the vehicle;
- a storage unit coupled to the at least one sensor to store the parameters; and
- a processor coupled to the storage unit to determine a charge status of the battery using the parameters stored in the storage unit, the parameters including:
- an initial value of the electric quantity just before start-up of the engine;
- a drop of the electric quantity just after start-up of the engine to a value below the initial value; and
- a rise time of the electric quantity, from the value below the initial value to at least back to the initial value.

19. The apparatus of claim 18 wherein the electric quantity is a voltage of the battery.

20. The apparatus of claim 18 wherein processor is adapted to determine the charge status of the battery without using determined battery temperature.

* * * * *